(12) United States Patent
Lim et al.

(10) Patent No.: US 8,741,116 B2
(45) Date of Patent: Jun. 3, 2014

(54) SPUTTERING APPARATUS, METHOD OF OPERATING THE SAME, AND METHOD OF MANUFACTURING SUBSTRATE USING THE SAME

(75) Inventors: Tae Hyun Lim, Gyeongbuk (KR); Hwan Kyu Yoo, Gyeonggi-do (KR); Byung Han Yun, Daegu (KR)

(73) Assignees: LG Display Co., Ltd., Seoul (KR); AVACO Co., Ltd., Daegu-si (KR); LG Electronics Inc., Seoul (KR)

( * ) Notice: Subject to any disclaimer, the term of this patent is extended or adjusted under 35 U.S.C. 154(b) by 47 days.

(21) Appl. No.: 13/238,500

(22) Filed: Sep. 21, 2011

(65) Prior Publication Data
US 2012/0006266 A1 Jan. 12, 2012

Related U.S. Application Data

(62) Division of application No. 11/802,174, filed on May 21, 2007, now Pat. No. 8,052,850.

(30) Foreign Application Priority Data

May 22, 2006 (KR) .................. 10-2006-0045490

(51) Int. Cl.
*C23C 14/34* (2006.01)
(52) U.S. Cl.
USPC ................................. 204/298.26; 204/298.22
(58) Field of Classification Search
USPC ...................................... 204/298.26, 298.22
See application file for complete search history.

(56) References Cited

U.S. PATENT DOCUMENTS

| | | | |
|---|---|---|---|
| 6,077,406 A * | 6/2000 | Kawakubo et al. | 204/298.12 |
| 6,290,826 B1 | 9/2001 | Obinata et al. | |
| 6,336,999 B1 | 1/2002 | Lemmer et al. | |
| 6,800,183 B2 * | 10/2004 | Takahashi | 204/298.28 |
| 2001/0045352 A1 * | 11/2001 | Robinson et al. | 204/192.11 |
| 2004/0231973 A1 | 11/2004 | Sato et al. | |
| 2005/0252768 A1 | 11/2005 | Bangert et al. | |

FOREIGN PATENT DOCUMENTS

| | | |
|---|---|---|
| CN | 1693532 | 11/2005 |
| JP | 2004-346387 A | 12/2004 |
| KR | 1020040101908 A | 12/2004 |

OTHER PUBLICATIONS

Korean Office Action dated Jun. 19, 2012, in a Korean counterpart application.

* cited by examiner

*Primary Examiner* — Keith Hendricks
*Assistant Examiner* — Jason M Berman
(74) *Attorney, Agent, or Firm* — Morgan, Lewis & Bockius LLP

(57) ABSTRACT

A sputtering apparatus includes a susceptor for receiving a substrate, and a first target device disposed to be opposite to a center region of a substrate and at least second and third target devices disposed to be opposite to peripheral regions of the substrate, wherein the second and third target devices are rotatable.

13 Claims, 6 Drawing Sheets

SPUTTERING APPARATUS, METHOD OF OPERATING THE SAME, AND METHOD OF MANUFACTURING SUBSTRATE USING THE SAME

This invention is a divisional application of application Ser. No. 11/802,174, filed on May 21, 2007 now U.S. Pat. No. 8,052,850, which claims the benefit of Korean Patent Application No. 10-2006-045490 filed in Korea on May 22, 2006, both of which are hereby incorporated by reference in its entirety.

BACKGROUND OF THE INVENTION

1. Field of the Invention

Embodiments of the present invention relate to a processing apparatus, and more particularly, to a sputtering apparatus for processing a large-scale substrate, a method of operating the sputtering apparatus, and a method of manufacturing a substrate using the sputtering apparatus.

2. Description of the Related Art

A display panel, such as a liquid crystal display device (LCD) or a plasma display panel (PDP) is built upon a substrate through a plurality of processes, such as a deposition process and an etching process. Each of the processes is performed using a separate processing apparatus. Among the apparatuses, a sputtering apparatus for forming a thin film is essential for manufacturing the display panel.

Figure 1:
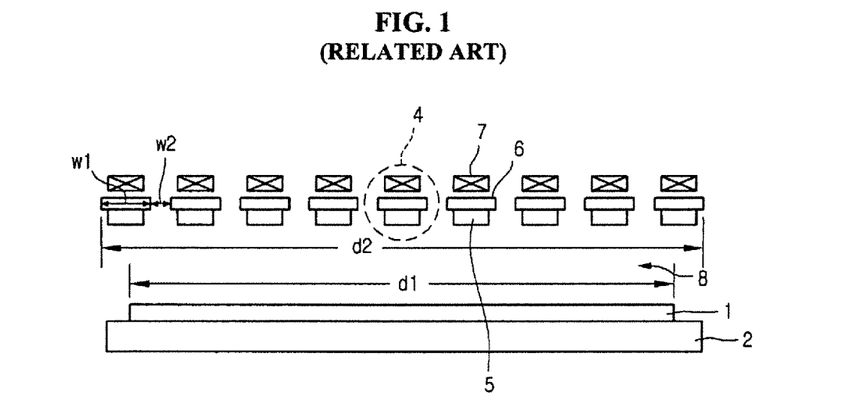
FIG. 1 is a cross-sectional view of a sputtering apparatus according to the related art.

FIG. 1 is a cross-sectional view of a sputtering apparatus according to the related art. Referring to FIG. 1, the sputtering apparatus includes a susceptor 2 and a plurality of target devices 4 that are disposed to face the susceptor 2. A substrate 1 to be processed is securely seated on the susceptor 2, and a predetermined positive voltage is supplied to the susceptor 2.

As shown in FIG. 1, the target devices 4 are arranged along a line in such a way that they face the susceptor 2 or the substrate 1 on the susceptor 2. The width "w2" of a gap between adjacent target devices 4 is very small so that target particles are uniformly deposited on the substrate 1. For example, the width "w2" of a gap between adjacent target devices 4 is much smaller than the width "w1" of each of the target devices 4.

Each target device 4 includes a target 5, a baking plate 6, and a magnet 7. Thus, the sputtering apparatus including a plurality of target. devices 4 has a plurality of targets 5, a plurality of baking plates 6, and a plurality of magnets 7. A predetermined negative voltage is applied to each target 5, and target particles are emitted from each target 5 because of collisions between each target 5 and ions.

The target 5 is fixed on the front surface of the baking plate 6 that faces the susceptor 2. Each baking plate 6 supports the target 5 and dissipates heat from the target 5. The magnet 7 is disposed on the rear surface of the baking plate 6 such that the magnet 7 induces electrons to be collected to facilitate a plasma discharge in an internal space 8 between the target 5 and the susceptor 2. The space 8 between the target 5 and the susceptor 2 is filled with inert gas, such as Ar gas, for plasma discharge.

When a predetermined high voltage is applied between the susceptor 2 and the target 5 as a result of the predetermined negative voltage applied to each target 5 and the predetermined positive voltage supplied to the susceptor 2, the Ar gas in the space 8 between the target 5 and the susceptor 2 is ionized into $Ar^+$ ions that form a plasma. Because more electrons are collected by the magnetic field of the magnet 7, the generated plasma can become high-density plasma. A region of the high-density plasma contains $Ar^+$ ions. A predetermined potential difference occurs between the high-density plasma region and the target 5 supplied with the predetermined negative voltage. The $Ar^+$ ions contained in the high-density plasma region are accelerated by the energy of the predetermined potential difference so as to collide against the target 5. These collisions cause the target 5 to emit target particles, and the emitted target particles are deposited on the substrate 1.

As the size of a substrate to be processed increases, the size of the sputtering apparatus for processing a substrate must also increase. In particular, the number of the target devices 4 increases as the size of the substrate 1 increases, thereby increasing costs of the sputtering apparatus. To uniformly deposit target particles out to an edge region of the substrate 1, the target devices 4 are provided such that the total distribution width d2 of the target devices 4 is greater than the width "d1" of the substrate 1. Thus, the size of the sputtering apparatus is actually greater than the size of the substrate 1.

Figure 2:
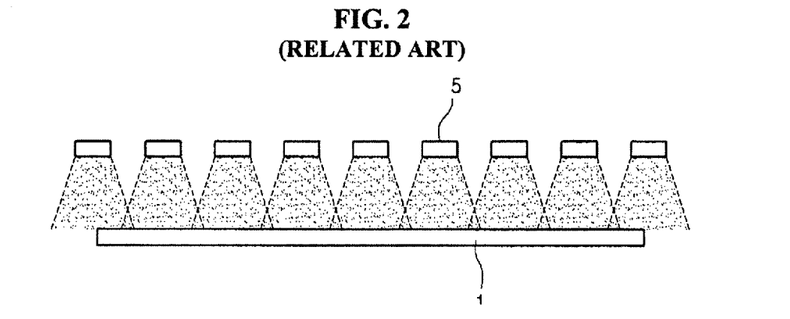
FIG. 2 is a schematic cross-sectional view showing the propagation directions of target particles that are emitted from targets of the related art sputtering apparatus.
Figure 3:
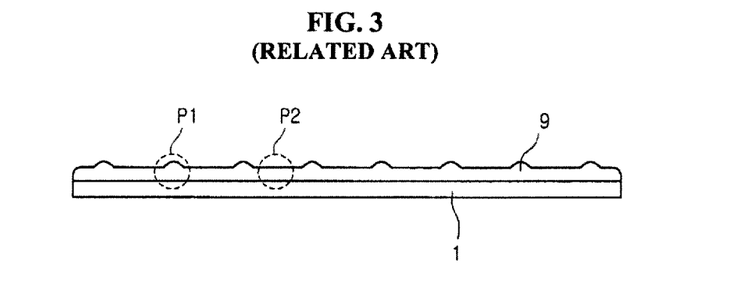
FIG. 3 is a cross-sectional view showing the shape of a layer that is formed on a substrate manufactured using the related art sputtering apparatus.

The target devices 4 are affixed to an external wall or a support such that the target devices 4 do not move or rotate in any direction. Target particles emitted from each of the targets 5 are deposited on portions of the facing substrate 1 respectively facing each of the targets. FIG. 2 is a schematic cross-sectional view showing the propagation directions of target particles that are emitted from targets of the related art sputtering apparatus. As shown in FIG. 2, the target 5 is impacted by $Ar^+$ ions located at the front of the target 5 such that target particles are emitted from the target 5 in a slightly spread distribution pattern and deposit on the facing substrate 1. Because of the slightly spread distribution pattern, target particles from adjacent targets 5 adjacent to each other can be deposited on the same portion of the substrate 1. Accordingly, as shown in FIG. 3, more target particles are deposited on first portions p1 of the substrate 1 which are directly opposite to boundary regions between adjacent targets 5, than on second regions p2 of the substrate 1, which are directly opposite to the targets 5. Consequently, a layer 9 formed on the substrate 1 from the target particles has an uneven surface. Such an uneven layer 9 has poor performance in terms of operational characteristics and image-quality characteristics.

SUMMARY OF THE INVENTION

Accordingly, embodiments of the present invention are directed to a sputtering apparatus, a method of operating the same, and a method of manufacturing a substrate using the same that substantially obviate one or more problems due to limitations and disadvantages of the related art.

An object of embodiments of the present invention is to provide a sputtering apparatus with a reduced size, a method of operating the same, and a method of manufacturing a substrate using the same.

Another object of the present invention is to provide a sputtering apparatus capable of reducing costs, a method of operating the same, and a method of manufacturing a substrate using the same.

Another object of the present invention is to provide a sputtering apparatus capable of providing uniformity, a method of operating the same, and a method of manufacturing a substrate using the same.

Additional advantages, objects, and features of the invention will be set forth in part in the description which follows and in part will become apparent to those having ordinary skill in the art upon examination of the following or may be learned from practice of the invention, The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a sputtering apparatus having a susceptor for receiving a substrate, and a first target device disposed to be opposite to a center region of a substrate and at least second and third target devices disposed to be opposite to peripheral regions of the substrate, wherein the second and third target devices emit target particles in non-fixed directions so as to form a substantially uniform sputtered layer on the substrate.

In another aspect of the present invention, there is provided a method of operating a sputtering apparatus, which includes a substrate on a susceptor, a first target device disposed opposite to a center region of a substrate and at least second and third target devices disposed opposite to peripheral regions of the substrate, the method includes rotating each of the second and third rotatable target devices in a first direction during a first operating period, and rotating each of second and third rotatable target devices in a second direction during a second operating period.

In yet another aspect of embodiments of the present invention, there is provided a method of manufacturing a substrate using a sputtering apparatus, including susceptor, a first target device disposed opposite to a center region of a substrate and at least second and third target devices disposed opposite to peripheral regions of the substrate, the method includes seating the substrate on the susceptor, rotating the second and third target devices, and depositing a material on the substrate using the rotating second and third devices.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 4:
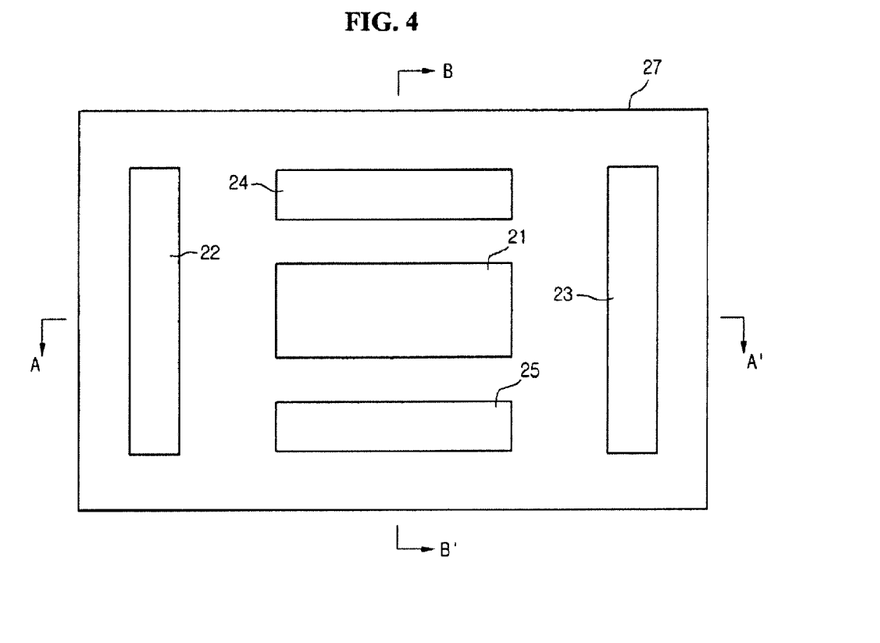
FIG. 4 is a plan view of a sputtering apparatus according to a first embodiment of the present invention.
Figure 5A:
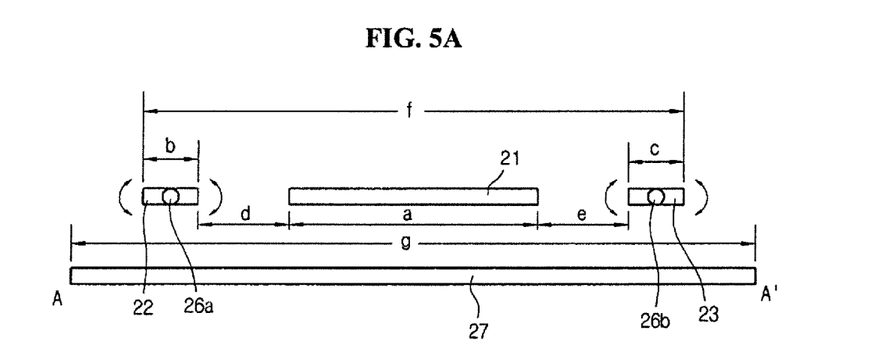
FIG. 5A is a cross-sectional view taken along a line A-A' of FIG. 4.
Figure 5B:
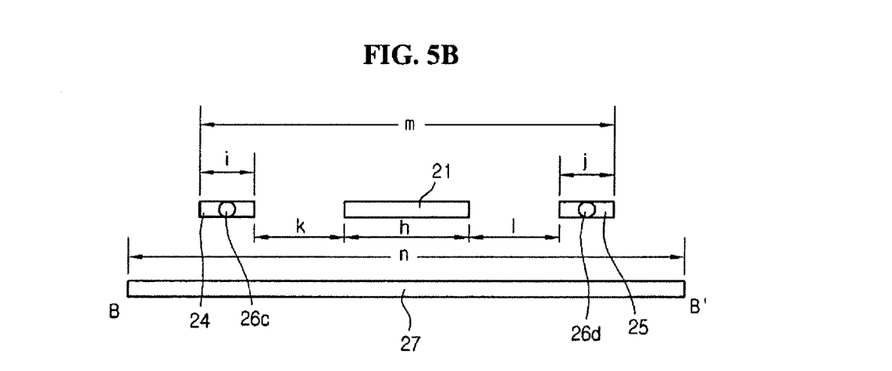
FIG. 5B is a cross-sectional view taken along a line B-B' of FIG. 4.

FIG. 4 is a plan view of a sputtering apparatus according to a first embodiment of the present invention. FIG. 5A is a cross-sectional view taken along line A-A' of FIG. 4. FIG. 5B is a cross-sectional view taken along line B-B' of FIG. 4. Referring to FIGS. 4, 5A and 5B, the sputtering apparatus according to the first embodiment includes a susceptor (not shown) and a plurality of target devices 21 to 25 that are disposed to face the susceptor. A substrate 27 is can be positioned on the susceptor with a positive voltage supplied to the susceptor. Each of the target devices 21 to 25 includes a target (not shown), a baking plate (not shown), and a magnet (not shown). A negative voltage can be supplied to the target such that target particles are emitted from the target. The baking plate dissipates heat from the target. The magnet induces formation of a high-density plasma. The target, the baking plate, and the magnet are known in the related art and thus a detailed description of these components will be omitted for conciseness.

The first target device 21 is disposed at a center region and is affixed to, for example, a chamber (not shown) of the sputtering apparatus. The second to fifth target devices 22 to 25 are each rotatable about axes parallel to the substrate 27 and are disposed adjacent to the first target device 21. The first to fifth target devices 21 to 25 can be disposed in the same plane. If necessary, the first target device 21 can also be rotatable. In the case of the first target device 21 being rotatable, the first target device 21 may be at first orientation during a first operating period, and then rotated to be at a second orientation during a second operating period.

The following description will be given presuming that the first target device 21 does not rotate, but embodiments of the present invention are not limited to this. That is, the first target device 21 may rotate. Each of the first to fifth target devices 21 to 25 has the shape of a rectangle elongated in one of two directions. The rectangular shape is merely an exemplary embodiment, each of the first to fifth target devices 21 to 25 can have other shapes, such as a square or a round-edged rectangle.

As shown in FIG. 4, the first target device 21 has a rectangular shape elongated in a first direction. In addition, second and third target devices 22 and 23 are arranged on the short lateral sides of the first target device 21 and have a rectangular shape elongated in the second direction perpendicular to the first direction, and fourth and fifth target devices 24 and 25 are arranged on the long lateral sides of the first target device 21 and have a rectangular shape elongated in the first direction. Because it is presumed that the first target device 21 does not rotate, a shaft to rotate the first target device 21 is not affixed to the first target device 21. However, when the first target device 21 is rotatable, a shaft having an axial direction in the first direction is affixed to the first target device 21.

Because the second to fifth target devices 22 to 25 are rotatable, shafts 26a, 26b, 26c and 26d are attached to the second to fifth target devices 22 to 25. The shafts 26a, 26b, 26c and 26d are attached to the second to fifth target devices 22 to 25 so as to be parallel to the longer lateral sides of the second to fifth target devices 22 to 25. More specifically, the second to fifth target devices 22 to 25 rotate back and forth in clockwise or counterclockwise directions by a predetermined rotation angle. For example, the rotation angle of the second to fifth target devices 22 to 25 can be in the range of 0° to 45°. Accordingly, the second to fifth target devices 22 to 25 can rotate clockwise by a rotation angle of 0° to 45° or counterclockwise by a rotation angle of 0° to 45°. The shafts 26a, 26b, 26c and 26d may be affixed to the second to fifth target devices 22 to 25 so as to be parallel to the substrate 27 and spaced apart from the substrate 27 by a predetermined distance.

As described above, when the second to fifth target devices 22 to 25 have the shape of a rectangle, each of the shafts 26a, 26b, 26c and 26d can be respectively attached to the second to fifth target devices 22 to 25 to have an axial direction same as a direction of the long lateral sides of the target device to which each shaft is attached. In other words, the axial direction of the shafts 26a and 26b for the second and third target devices 22 and 23 is perpendicular to another axial direction of the shafts 26c and 26d for the fourth and fifth target devices 24 and 25. Accordingly, the axial direction of the shafts 26c and 26d installed in the fourth and fifth target devices 24 and 25 is in the first direction and the axial direction of shafts 26a and 26b attached to the second and third target devices 22 and 23 are in the second direction perpendicular to the first direction.

As shown in FIG. 5A, the first to third target devices 21 to 23 along the first direction has the dimensions of the first target device 21 with a lateral width "a", the second target device 22 with a longitudinal width "b", the third target device 23 with a longitudinal width "c", the gap "d" between the first and second target devices 21 and 22, and the gap "e" between the first and third target devices 21 and 23. Consequently, the width "f" is the total dimension along the first direction for the first to third target devices 21 to 23.

As shown in FIG. 5B, the first, fourth and fifth target devices 21, 24 and 25 are arranged along the second direction has the dimensions of the first target device 21 with a longitudinal width "h", the fourth target device 24 with a longitudinal width "i", the fifth target device 25 with a longitudinal width "j", the gap "k" between the first and fourth target devices 21 and 24, and the gap "l" between the first and fifth target devices 21 and 25. Consequently, the width "m" is the total dimension along the second direction for the first, fourth and fifth target devices 21, 24 and 25.

The substrate 27 has a lateral width "g" in a first direction and a longitudinal width "n" in a second direction. For example, the lateral width "g" is greater than the longitudinal width "n". In this case, the total width "f" of the first to third target devices 21 to 23 is smaller than the lateral width "g" of the substrate 27, and the total width "m" of the first, fourth and fifth target devices 21, 24 and 25 is smaller than the longitudinal width "n" of the substrate 27. In addition, the lateral width "b" of the second target device 22 is smaller than the gap "d" between the first and second target devices 21 and 22, and the lateral width "c" of the third target device 23 is smaller than the gap "e" between the first and third target devices 21 and 23. Likewise, the longitudinal width "i" of the fourth target device 24 is smaller than the gap "k" between the first and fourth target devices 21 and 24, and the longitudinal width "j" of the fifth target device 25 is smaller than the gap "l" between the first and fifth target devices 21 and 25.

The substrate can be larger than the sputtering apparatus because the second to fifth target devices 22 to 25 can pivot or rotate. That is, when the second to fifth target devices 22 are 25 rotated to pivot into one orientation and then rotated again to pivot into a second orientation, target particles can be distributed onto portions of the substrate other than directly opposite to the second and fifth target devices 22 to 25. Thus, the total width "f" and "m" can be smaller than the width "g" and "n" and the width "b", "c", "i" and "j" can be smaller than the gap "d", "e", "k" and The following description will be given assuming that each of the first to fifth target devices 21 to 25 has the shape of a rectangle, but embodiments of the present invention are not limited thereto. The second to fifth target devices 22 to 25 rotate back and forth between first and second orientations on the shafts 26a, 26b, 26c and 26d, The shafts 26a, 26b, 26c and 26d can be attached to the second to fifth target devices 22 to 25 in such a way that the axial direction is parallel to the substrate 27 along its length direction. For example, the second to fifth target devices 22 to 25 may rotate clockwise from the first orientation to the second orientation during the first operating period, and counterclockwise from the second orientation to the first orientation during the second operating period. These rotations may be performed repeatedly.

At the first orientation of the second and third target devices 22 and 23, target particles emitted from the second and third target devices 22 and 23 can be deposited on regions of the substrate at one side of portions of the substrate 27 that are directly opposite to the second and third target devices 22 and 23. In addition, at the second orientation of the second and third target devices 22 and 23, target particles emitted from the second and third target devices 22 and 23 can be deposited on other regions of the substrate at another side of portions of the substrate 27 that are directly opposite to the second and third target devices 22 and 23. Likewise, at the first orientation of the fourth and fifth target devices 24 and 25, target particles emitted from the fourth and fifth target devices 24 and 25 can be deposited on regions of the substrate at one side of portions of the substrate 27 that are directly opposite to the fourth and fifth target devices 24 and 25. In addition, at the second orientation of the fourth and fifth target devices 24 and 25, target particles emitted from the fourth and fifth target devices 24 and 25 can be deposited on other regions of the substrate at another side of portions of the substrate 27 that are directly opposite to the fourth and fifth target devices 24 and 25.

The rotations of the second to fifth target devices 22 to 25 create a uniform thin film on areas of the substrate that are not directly opposite to the second to fifth target devices 22 to 25. Accordingly, because the total width "f" and "m" can be smaller than the width "g" and "n", and the gap "d", "e", "k" and "l" can be greater than the width "b", "c", "i" and "j", the number of the target devices can be reduced and thus the manufacturing cost can be reduced. In addition, the total width "f" and "m" and thus the total volume of the sputtering device can be reduced, thereby reducing the occupation area.

Figure 6:
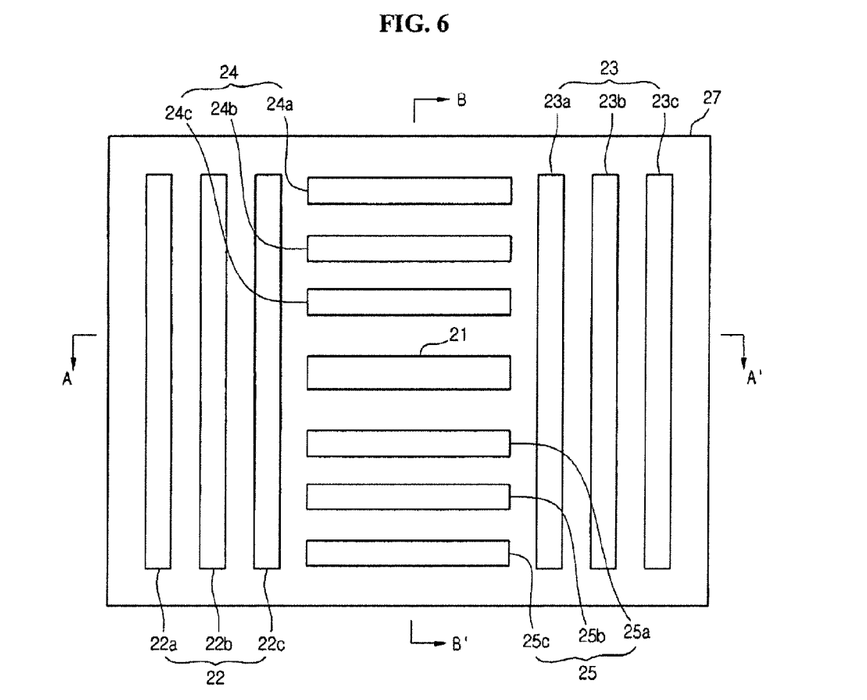
FIG. 6 is a plan view of a sputtering apparatus according to a second embodiment of the present invention.
Figure 7A:
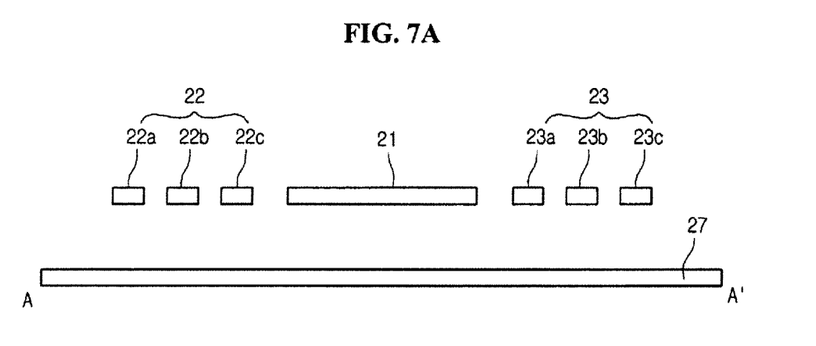
FIG. 7A is a cross-sectional view taken along a line A-A' of FIG. 6.
Figure 7B:
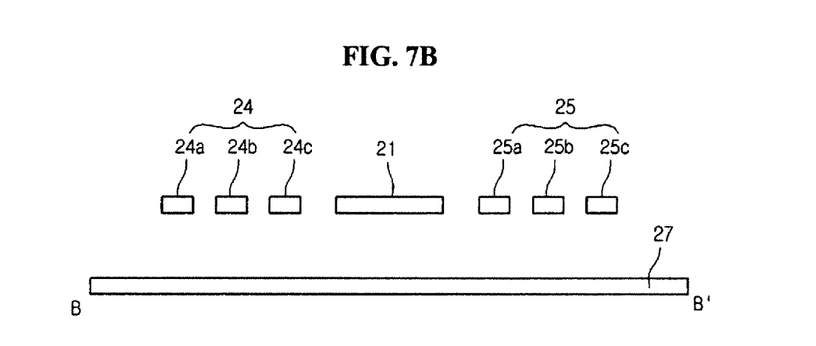
FIG. 7B is a cross-sectional view taken along a line B-B' of FIG. 6.

FIG. 6 is a plan view of a sputtering apparatus according to a second embodiment of the present invention. FIG. 7A is a cross-sectional view taken along a line A-A' of FIG. 6. FIG. 7B is a cross-sectional view taken along a line B-B' of FIG. 6. The second embodiment is fundamentally similar to the first embodiment with the exception that each of the second to fifth target devices 22 to 25 includes a plurality of sub-target devices. For example, the second target device 22 includes a plurality of sub-target devices 22a and 22c, the third target device 23 includes a plurality of sub-target devices 23a and 23c, the fourth target device 24 includes a plurality of sub-target devices 24a and 24c, and the fifth target device 25 includes a plurality of sub-target devices 25a and 25c.

FIGS. 6, 7A and 7B illustrate that the first target device 21 is provided as a single device. However, the first target device 21 may include a plurality of sub-target devices. The plurality of sub-target devices of the second to fifth target devices 22 to 25 rotate about their shaft (not shown). The following description will be given assuming that no shaft is installed in the first target device 21 and thus the first target device 21 cannot rotate. However, when the first target device 21 rotates, a shaft can be attached to the first target device 21. The second to fifth target devices 22 to 25 operate in a similar manner. The following description will focus on, for example, the third target device 23 for conciseness, which can have first to fifth sub-target devices.

Figure 8:
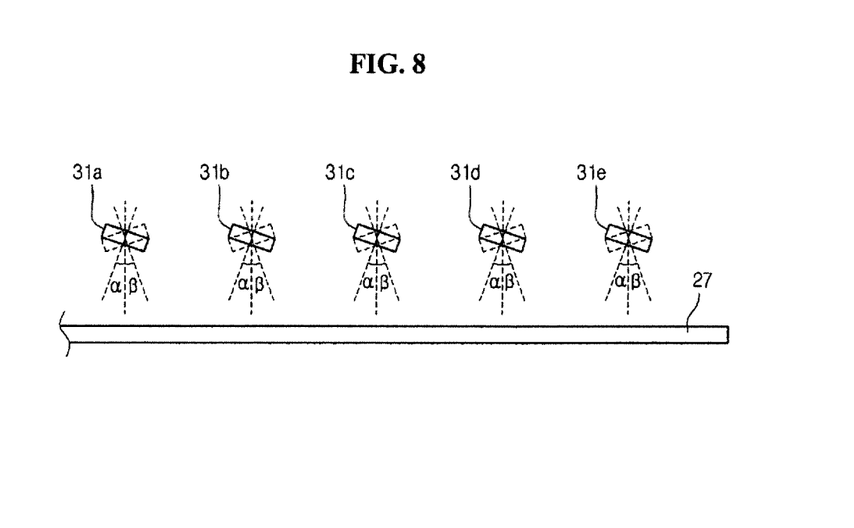
FIG. 8 is a schematic cross-sectional view showing a case where the sub-target devices of FIG. 6 rotate in the same direction.

FIG. 8 is a schematic cross-sectional view showing a case where the sub-target devices of FIG. 6 rotate in the same direction. Referring to FIG. 8, the first to fifth sub-target devices 31a to 31e of the third target device 23 can rotate in the same direction by the same rotation angle. For example, all of the first to fifth sub-target devices 31a to 31e may rotate clockwise to a first orientation angle "α" with respect to normal during a first operating period, and counterclockwise to a second orientation angle "β" with respect to normal during a second operating period. The first and second orientation angles "α" and "β" can be the same size. A uniform layer can be formed on portions of the substrate 27 directly opposite to the sub-target device 31a to 31e and regions of the substrate 27 outside of portions of the substrate 27 directly opposite to the sub-target device 31a to 31e. Each of the first and second orientation angles "α" and "β" can be in the range of 0° to 45°. When each of the first and second orientation angles "α" and "β" is greater than 45°, interference may occur between the adjacent target devices, thereby obstructing the formation of a uniform layer.

Figure 9:
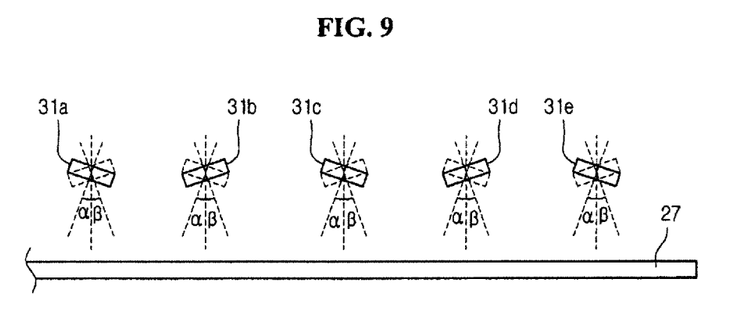
FIG. 9 is a schematic cross-sectional view showing a case where the sub-target devices of FIG. 6 rotate in opposite directions from each other.

FIG. 9 is a schematic cross-sectional view showing a case where the sub-target devices of FIG. 6 rotate in opposite directions from each other. Referring to FIG. 9, the first to fifth sub-target devices 31a to 31e can alternately rotate in opposite directions from each other. For example, the first sub-target device 31a rotates clockwise to a first orientation angle "α", the second sub-target device 31b rotates counterclockwise to a second orientation angle "β", the third sub-target device 31c rotates clockwise to the first orientation angle "α", the fourth sub-target device 31d rotates counterclockwise to the second orientation angle "β", and the fifth sub-target device 31e rotates clockwise to the first orientation angle "α". The first and second orientation angles "α" and "β" can be identical in size. Each of the first and second orientation angles "α" and "β" be in the range of 0° to 45°.

Figure 10:
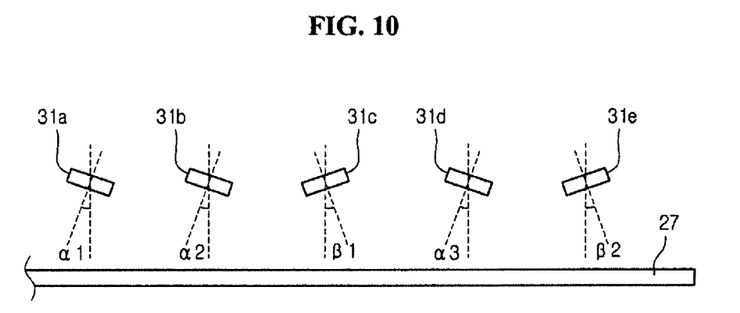
FIG. 10 is a schematic cross-sectional view showing a case where the sub-target devices of FIG. 6 rotate at different times to different orientation angles.

FIG. 10 is a schematic cross-sectional view showing a case where the sub-target devices of FIG. 6 rotate in different directions to different orientation angles. Referring to FIG. 10, the first to fifth sub-target devices 31a to 31e can rotate in different directions to different orientation angles. For example, the first sub-target device 31a rotates clockwise to a first orientation angle "α1", the second sub-target device 31b rotates clockwise to a second orientation angle "α2", the third sub-target device 31c rotates counterclockwise to a third orientation angle "β1", the fourth sub-target device 31d rotates clockwise by a fourth orientation angle "α3", and the fifth sub-target device 31e rotates counterclockwise to a fourth orientation angle "β2".

Figure 11:
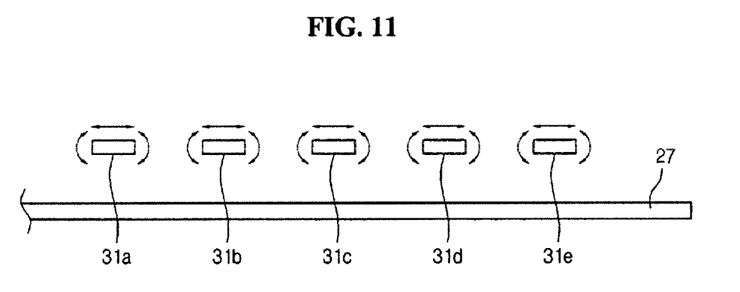
FIG. 11 is a cross-sectional view showing a case where the sub-target devices of FIG. 6 rotate and shift.

FIG. 11 is a cross-sectional view showing a case where the sub-target devices of FIG. 6 rotate and shift. Referring to FIG. 11, the first to fifth sub-target devices 31a to 31e can rotate clockwise or counterclockwise and simultaneously can shift in a direction parallel to the substrate 27. For example, during a first operating period, the first to fifth sub-target devices 31a to 31e shift in the left direction and simultaneously rotate clockwise or counterclockwise, so that target particles can be uniformly deposited across to one side of the substrate 27. Thereafter, during a second operating period, the first to fifth sub-target devices 31a to 31e shift in the right direction and simultaneously rotate clockwise or counterclockwise, so that target particles can be uniformly deposited across to the other side of the substrate 27.

By rotating or shifting the target devices, embodiments of the present invention reduce the total width of the target devices in relation to the width of the substrate so as to reduce the size of the sputtering apparatus. Also, by rotating or shifting the target devices, embodiments of the present invention can reduce the number of target devices so as to reduce the manufacturing cost because a single targeting device can cover more area of the substrate.

According to embodiments of the present invention, a target device is disposed to be opposite to the center region of the substrate and other target devices are disposed to be opposite to peripheral regions (i.e., the left, right, upper and lower regions) of the substrate adjacent to the center region. In this case, the target devices opposite to the peripheral regions can rotate. Accordingly, a uniform layer can be formed on the substrate, thereby providing for high reliability.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A sputtering apparatus comprising:
a susceptor for receiving a substrate;
a first target device having an elongated shape in a first direction and disposed on a first region of the substrate opposite to a center region of a substrate;
at least second and third target devices each having an elongated shape in a second direction perpendicular to the first direction and disposed on second and third regions of the substrate opposite to opposite first and second side regions of the substrate; and
at least fourth and fifth target devices each having an elongated shape in the first direction and disposed on fourth and fifth regions of the substrate opposite to opposite third and fourth side regions of the substrate;
wherein each of the second and third target devices rotates to a first orientation angle in a first direction and rotates to a second orientation angle in a second direction opposite to the first direction,
wherein the fourth and fifth target devices rotate in opposite directions from each other to third and fourth orientation angles, and
wherein the second and third target devices are rotated with respect to first axes parallel to the second direction, and the fourth and fifth target devices are rotated with respect to second axes parallel to the first direction.

2. The sputtering apparatus according to claim 1, wherein the first, second and third target devices are disposed in the same plane.

3. The sputtering apparatus according to claim 1, wherein the first and second orientation angles are in a range of 0° to 45° with respect to normal.

4. The sputtering apparatus according to claim 1, wherein the second and third target devices are respectively attached to shafts that each have an axial direction same as a direction of long lateral sides of the second and third target device to which each shaft is attached.

5. The sputtering apparatus according to claim 1, wherein the first and second orientation angles are same size.

6. The sputtering apparatus according to claim 1, wherein each of the second and third target devices includes a plurality of sub-target devices.

7. The sputtering apparatus according to claim 6, wherein the sub-target devices rotate in opposite directions from each other to first and second orientation angles.

8. The sputtering apparatus according to claim 7, wherein the first and second orientation angles are in a range of 0° to 45° with respect to normal.

9. The sputtering apparatus according to claim 6, wherein each of the sub-target devices rotates in different directions.

10. The sputtering apparatus according to claim 9, wherein each of the sub-target devices rotates to different orientation angles.

11. The sputtering apparatus according to claim 1, wherein the width of each of the target devices is smaller than a gap therebetween.

12. The sputtering apparatus according to claim 1, wherein the first target device has an elongated shape in a first direction, and the second and third rotatable target devices have rotatable axes in a second direction perpendicular to the first direction.

13. The sputtering apparatus according to claim 1, wherein each of the second and third target devices shifts in a direction parallel to the substrate.

* * * * *